US012261163B2

(12) United States Patent
Chen et al.

(10) Patent No.: US 12,261,163 B2
(45) Date of Patent: Mar. 25, 2025

(54) MOLDED DIES IN SEMICONDUCTOR PACKAGES AND METHODS OF FORMING SAME

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW); Ming-Fa Chen, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 102 days.

(21) Appl. No.: 17/383,971

(22) Filed: Jul. 23, 2021

(65) Prior Publication Data
US 2022/0328467 A1 Oct. 13, 2022

Related U.S. Application Data

(60) Provisional application No. 63/172,349, filed on Apr. 8, 2021.

(51) Int. Cl.
*H01L 25/18* (2023.01)
*H01L 23/00* (2006.01)
(Continued)

(52) U.S. Cl.
CPC .......... *H01L 25/18* (2013.01); *H01L 23/3128* (2013.01); *H01L 23/481* (2013.01);
(Continued)

(58) Field of Classification Search
CPC . H01L 21/486; H01L 21/568; H01L 21/6835; H01L 2221/68345; H01L 2224/08146; H01L 2224/08225; H01L 2224/80001; H01L 2224/80006; H01L 2224/80013; H01L 2224/80357; H01L 2224/8083; H01L 2224/80895; H01L 2224/80896; H01L 2224/80906; H01L 2224/80948; H01L 2224/95; H01L 23/147;
(Continued)

(56) References Cited

U.S. PATENT DOCUMENTS 9,768,145 B2 * 9/2017 Yu ........................ H01L 24/03
10,529,697 B2 1/2020 Cheng et al.
(Continued)

FOREIGN PATENT DOCUMENTS

CN 106997869 B * 6/2020 ............. H01L 21/56
DE 102017124071 A1 3/2019
(Continued)

*Primary Examiner* — Telly D Green
(74) *Attorney, Agent, or Firm* — Slater Matsil, LLP

(57) ABSTRACT

A package includes an interposer having a first redistribution structure; a first die directly bonded to a first surface of the first redistribution structure with a dielectric-to-dielectric bond and a metal-to-metal bond; a second die directly bonded to the first surface of the first redistribution structure with a dielectric-to-dielectric bond and a metal-to-metal bond; an encapsulant around the first die and the second die; and a plurality of conductive connectors on a second side of the first redistribution structure opposite to the first die and the second die.

18 Claims, 17 Drawing Sheets

(51) Int. Cl.
*H01L 23/31* (2006.01)
*H01L 23/48* (2006.01)
*H01L 23/498* (2006.01)
*H01L 23/538* (2006.01)
*H01L 25/00* (2006.01)

(52) U.S. Cl.
CPC .... *H01L 23/49816* (2013.01); *H01L 23/5385* (2013.01); *H01L 24/08* (2013.01); *H01L 24/80* (2013.01); *H01L 25/50* (2013.01); *H01L 2224/08225* (2013.01); *H01L 2224/80895* (2013.01); *H01L 2224/80896* (2013.01)

(58) Field of Classification Search
CPC ... H01L 23/15; H01L 23/3128; H01L 23/481; H01L 23/49816; H01L 23/5383; H01L 23/5384; H01L 23/5385; H01L 24/08; H01L 24/80; H01L 25/0655; H01L 25/105; H01L 25/18; H01L 25/50; H01L 2924/15311
See application file for complete search history.

(56) References Cited

U.S. PATENT DOCUMENTS

| | | | | |
|---|---|---|---|---|
| 10,804,242 | B2* | 10/2020 | Yu | H01L 24/19 |
| 11,121,052 | B2* | 9/2021 | Lai | H01L 21/56 |
| 11,217,538 | B2* | 1/2022 | Liu | H01L 21/56 |
| 2014/0217610 | A1* | 8/2014 | Jeng | H01L 21/4857 257/774 |
| 2017/0062383 | A1* | 3/2017 | Yee | H01L 23/3675 |
| 2017/0229409 | A1* | 8/2017 | Hu | H01L 25/0655 |
| 2017/0358527 | A1 | 12/2017 | Lu et al. | |
| 2018/0005984 | A1* | 1/2018 | Yu | H01L 25/0655 |
| 2018/0082988 | A1* | 3/2018 | Cheng | H01L 21/561 |
| 2018/0138101 | A1 | 5/2018 | Yu et al. | |
| 2019/0088581 | A1* | 3/2019 | Yu | H01L 21/4857 |
| 2019/0109083 | A1* | 4/2019 | Yu | H01L 24/11 |
| 2019/0333871 | A1 | 10/2019 | Chen et al. | |
| 2020/0135683 | A1* | 4/2020 | Kim | H01L 24/09 |
| 2020/0168591 | A1* | 5/2020 | Kim | H01L 23/5283 |
| 2020/0176397 | A1* | 6/2020 | Liu | H01L 24/19 |
| 2020/0251397 | A1* | 8/2020 | Lai | H01L 21/565 |
| 2020/0312774 | A1* | 10/2020 | Yu | H01L 25/105 |
| 2020/0373271 | A1* | 11/2020 | Kim | H01L 23/49833 |
| 2020/0402965 | A1* | 12/2020 | Ng | H01L 25/105 |
| 2021/0028134 | A1* | 1/2021 | Gerber | H01L 24/08 |
| 2021/0028147 | A1* | 1/2021 | Yu | H01L 24/09 |
| 2021/0098353 | A1* | 4/2021 | Wu | H01L 23/15 |
| 2021/0098567 | A1 | 4/2021 | Kim et al. | |
| 2021/0225750 | A1 | 7/2021 | Yu et al. | |
| 2022/0122927 | A1* | 4/2022 | Liu | H01L 21/6835 |
| 2022/0262751 | A1* | 8/2022 | Zhang | H01L 25/0652 |

FOREIGN PATENT DOCUMENTS

| | | |
|---|---|---|
| KR | 20180030755 A | 3/2018 |
| KR | 20190032147 A | 3/2019 |
| TW | 201814850 A | 4/2018 |
| WO | 2012061304 A1 | 5/2012 |

* cited by examiner

MOLDED DIES IN SEMICONDUCTOR PACKAGES AND METHODS OF FORMING SAME

PRIORITY CLAIM AND CROSS-REFERENCE

This application claims the benefit of U.S. Provisional Application No. 63/172,349, filed on Apr. 8, 2021, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
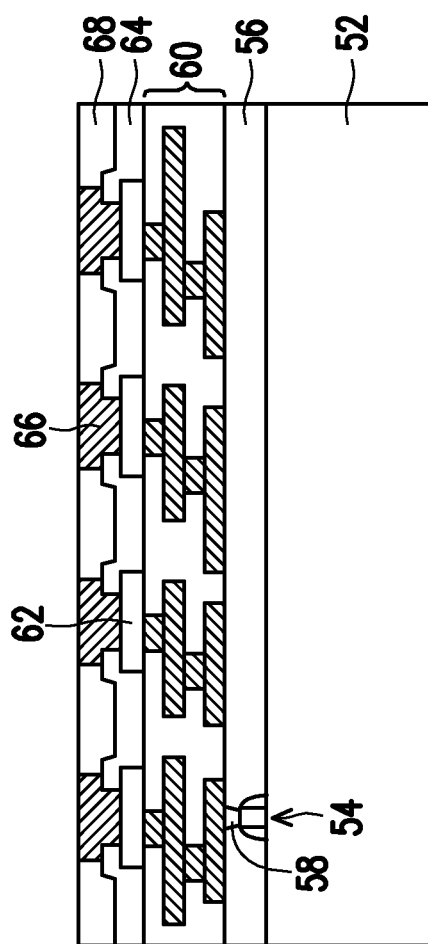
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an interposer structure is provided with semiconductor dies and/or die stacks directly bonded thereto. For example, a hybrid bonding process may be used to form direct metal-to-metal and direct insulator-to-insulator bonds between the interposer structure and other package components (the semiconductor dies and/or die stacks). Interconnections between the semiconductor dies and/or die stacks may be provided through the hybrid bonds and the interposer. Various embodiments may achieve one or more of the following, non-limiting advantages: finer bump pitch; small form factor (SFF) packages by using hybrid bonds; smaller bonding pitch scalability for chip I/O to realize high density die-to-die interconnects; improved mechanical endurance; improved electrical performance; reduced defects; and increased yield. Further, short die-to-die connection has the benefits of smaller form-factor, higher bandwidth, improved power integrity (PI), improved signal integrity (SI), and lower power consumption.

Various embodiments are described below in a particular context. Specifically, a chip on wafer on substrate type system on integrated chip (SoIC) package is described. However, various embodiments may also be applied to other types of packaging technologies, such as, integrated fan-out (InFO) packages, or the like.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62.

Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

The connectors 66 may be surrounded by a dielectric layer 68, which laterally encapsulates the die connectors 66, and is laterally coterminous with the integrated circuit die 50. In subsequent processing steps, the die connectors 66 and the dielectric layer 68 may be used to directly bond the integrated circuit die 50 to another package component (e.g., an interposer structure). Accordingly, the dielectric layer 68 may also be referred to as a bonding layer and may be made of any suitable material for direct bonding such as an oxide (e.g., silicon oxide), a nitride (e.g., silicon nitride), an oxynitride (e.g., silicon oxynitride), or the like. The dielectric layer 68 may be formed, for example, by spin coating, chemical vapor deposition (CVD), atomic layer deposition (ALD), or the like. Initially, the dielectric layer 68 may be deposited to bury the die connectors 66, such that the topmost surface of the dielectric layer 68 is above the topmost surfaces of the die connectors 66. A planarization process (e.g., a chemical mechanical polish (CMP), etch back process, or the like) may then be applied to level top surfaces of the die connectors 66 and the dielectric layer 68 such that the die connectors 66 are exposed.

In some embodiments, the integrated circuit die 50 is part of die stack that includes multiple semiconductor substrates 52. For example, the die stack may be a memory device such as a hybrid memory cube (HMC) module, a high bandwidth memory (HBM) module, or the like that includes multiple memory dies. In such embodiments, the die stack includes multiple integrated circuit die 50 interconnected by through-substrate vias (TSVs), which extend through the substrates 52 of the integrated circuit dies 50. Each of the semiconductor substrates 52 may (or may not) have an interconnect structure 60.

FIGS. 2 through 9 illustrate cross-sectional views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B.

Figure 2:
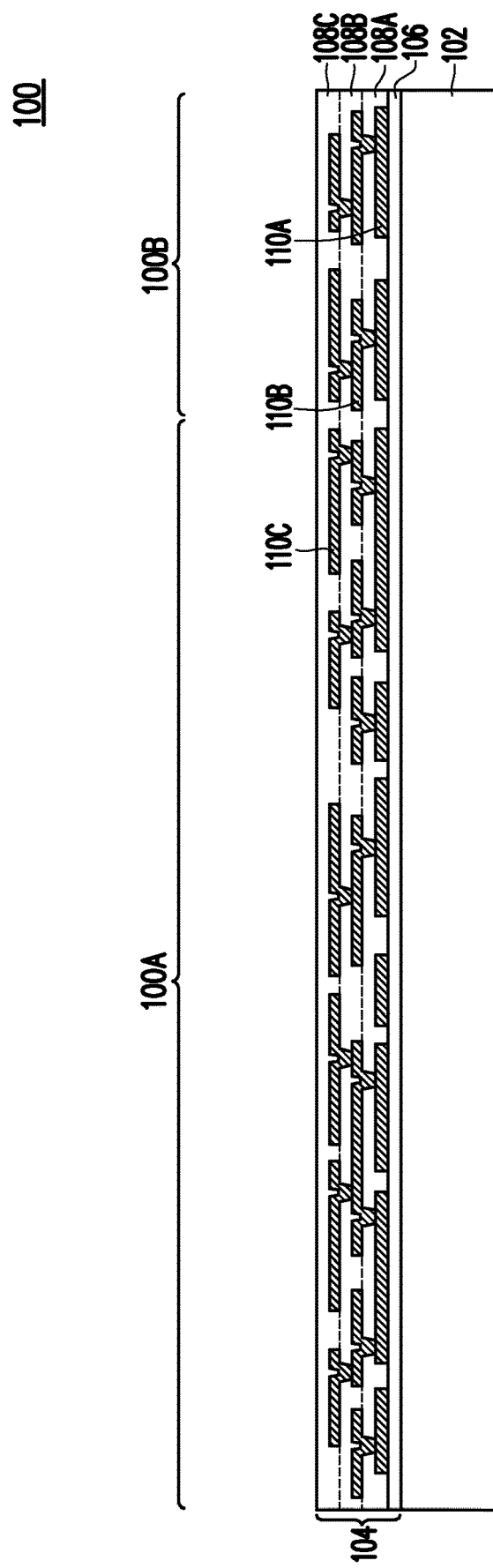
FIGS. 2 through 9 illustrate cross-sectional views of intermediate steps during a process for forming a semiconductor package in accordance with some embodiments.

In FIG. 2, a carrier substrate 102 is provided. The carrier substrate 102 may be a glass carrier substrate, a ceramic carrier substrate, or the like. The carrier substrate 102 may be a wafer, such that multiple packages can be formed on the carrier substrate 102 simultaneously. The carrier substrate 102 may be a bulk material that is free of any active or passive devices, for example.

A redistribution structure 104 may be formed on the carrier substrate 102. In the embodiment shown, the redistribution structure 104 includes a dielectric layer 106, dielectric layers 108 (labeled 108A, 108B, and 108C), and metallization patterns 110 (sometimes referred to as redistribution layers or redistribution lines, labeled 110A, 110B, and 110C).

The dielectric layer 106 may be formed on the carrier substrate 102. The bottom surface of the dielectric layer 106 may be in contact with the top surface of the carrier substrate 102. In some embodiments, the dielectric layer 106 is formed of a polymer, such as polybenzoxazole (PBO), polyimide, benzocyclobutene (BCB), or the like. In other embodiments, the dielectric layer 106 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 106 may be formed by any acceptable deposition process, such as spin coating, CVD, laminating, the like, or a combination thereof. In some embodiments, the dielectric layer 106 may be free of any metallization patterns and protect overlying metallization patterns 110 from damage when the carrier substrate 102 is subsequently removed.

The metallization pattern 110A may be formed on the dielectric layer 106. As an example to form metallization pattern 110A, a seed layer is formed over the dielectric layer 106. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 110A. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110A.

The dielectric layer 108A may be formed on the metallization pattern 110A and the dielectric layer 106. In some embodiments, the dielectric layer 108A is formed of a polymer, which may be a photo-sensitive material such as PBO, polyimide, BCB, or the like, that may be patterned using a lithography mask. In other embodiments, the dielectric layer 108A is formed of a nitride such as silicon nitride; an oxide such as silicon oxide, PSG, BSG, BPSG; or the like. The dielectric layer 108A may be formed by spin coating, lamination, CVD, the like, or a combination thereof. The dielectric layer 108A is then patterned to form openings exposing portions of the metallization pattern 110A. The patterning may be formed by an acceptable process, such as by exposing the dielectric layer 108A to light when the dielectric layer 108A is a photo-sensitive material or by etching using, for example, an anisotropic etch. If the dielectric layer 108A is a photo-sensitive material, the dielectric layer 108A can be developed after the exposure.

Alternatively, in other embodiments that are not specifically illustrated, the dielectric layer 108A may be deposited prior to forming the metallization pattern 110A. For example, the dielectric layer 108A may be deposited of a similar material using a similar process as described above. After deposition, a damascene process (e.g., a dual damascene process or a single damascene process) may be used to pattern openings in the dielectric layer 108A. The patterning of the openings may correspond to a pattern of the metallization pattern 110A. The metallization pattern 110A may then be deposited in the openings, e.g., using a plating process. The metallization pattern 110A may initially overflow the openings, and a planarization process (e.g., a CMP process or the like) may be used to level top the dielectric layer 108A and the metallization pattern 110A.

Additional metallization patterns 110B and 110C may be formed over the metallization pattern 110A in dielectric layers 108B and 108C, respectively. Specifically, the metallization patterns 110B are formed in dielectric layers 108B, which is disposed over the dielectric layer 108A and the metallization patterns 110A. Further, the metallization patterns 110C are formed in dielectric layers 108C, which is disposed over the dielectric layer 108B and the metallization patterns 110B. Each of the dielectric layers 108B and 108C may by formed of a similar material and using similar processes as described above with respect to the dielectric layer 108A. Further, each of the metallization patterns 110B and 110C may be formed of a similar material and using similar processes as described above with respect to the metallization pattern 110A.

FIG. 2 illustrates a redistribution structure 104 having a specific number of metallization patterns (e.g., the metallization patterns 110A, 110B, and 110C) for illustrative purposes. In some embodiments, the back-side redistribution structure 104 may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines. Further, the completed redistribution structure 104 may be free of any active devices and/or free of any passive devices, and the carrier substrate 102 and the redistribution structure 104 may be collectively referred to as an interposer.

Figure 3:
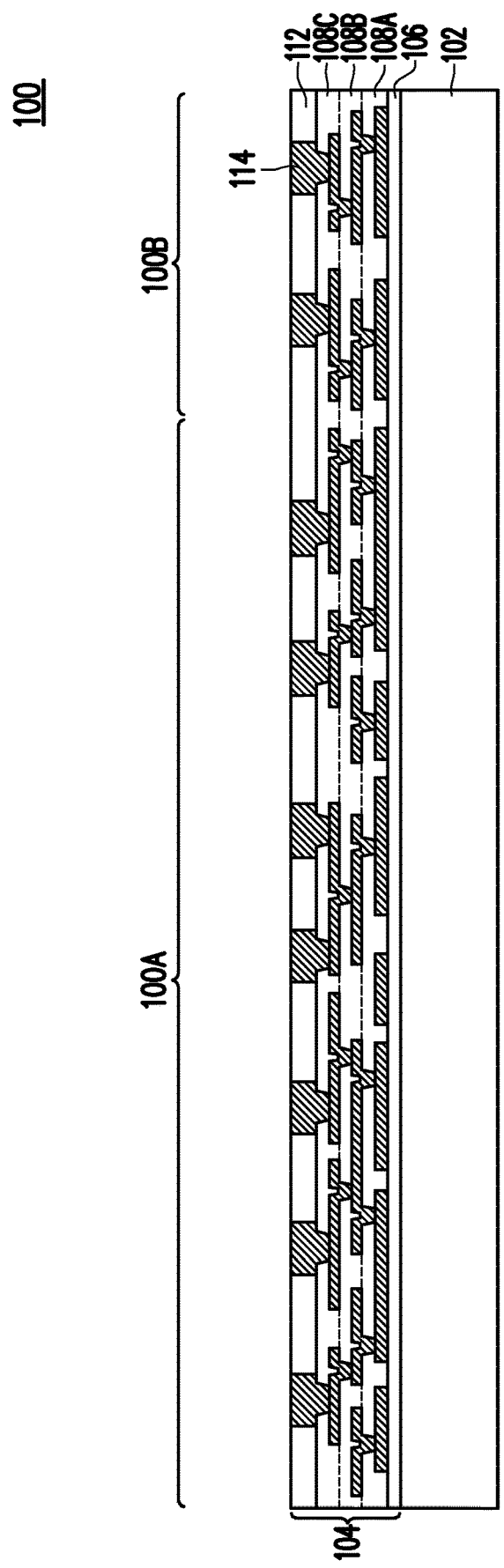

In FIG. 3, bonding pads 114 of the redistribution structure 104 are formed over the metallization pattern 110C and the dielectric layer 108C. The bonding pads 114 are formed for external connection to the redistribution structure 104. The bonding pads 114 have landing pad portions on and extending along the major surface of the dielectric layer 108C, and have via portions extending through the dielectric layer 108C to physically and electrically couple the metallization pattern 110C. As a result, the UBMs 122 are electrically coupled to the metallization patterns of the redistribution structure 104. The bonding pads 114 formed of a similar material and using similar processes as described above with respect to the metallization pattern 110A. In some embodiments, the bonding pads 114 have a different size (e.g., a different thickness) than the metallization patterns 110A, 110B, and 110C.

Also illustrated in FIG. 3, a bonding layer 112 of the redistribution structure 104 may be formed over the metallization pattern 110C and the dielectric layer 108C. The bonding pads 114 may be disposed in the bonding layer 112. The bonding layer 112 may be any material suitable for achieving a dielectric-to-dielectric bond. For example, the bonding layer 112 may comprise silicon oxide, silicon nitride, silicon oxynitride, or the like, and the bonding layer 112 may be deposited using a suitable deposition process such as PVD, CVD, ALD, or the like. A planarization step may then be performed to substantially level surfaces of the bonding pads 114 and the bonding layer 112.

Figure 4:
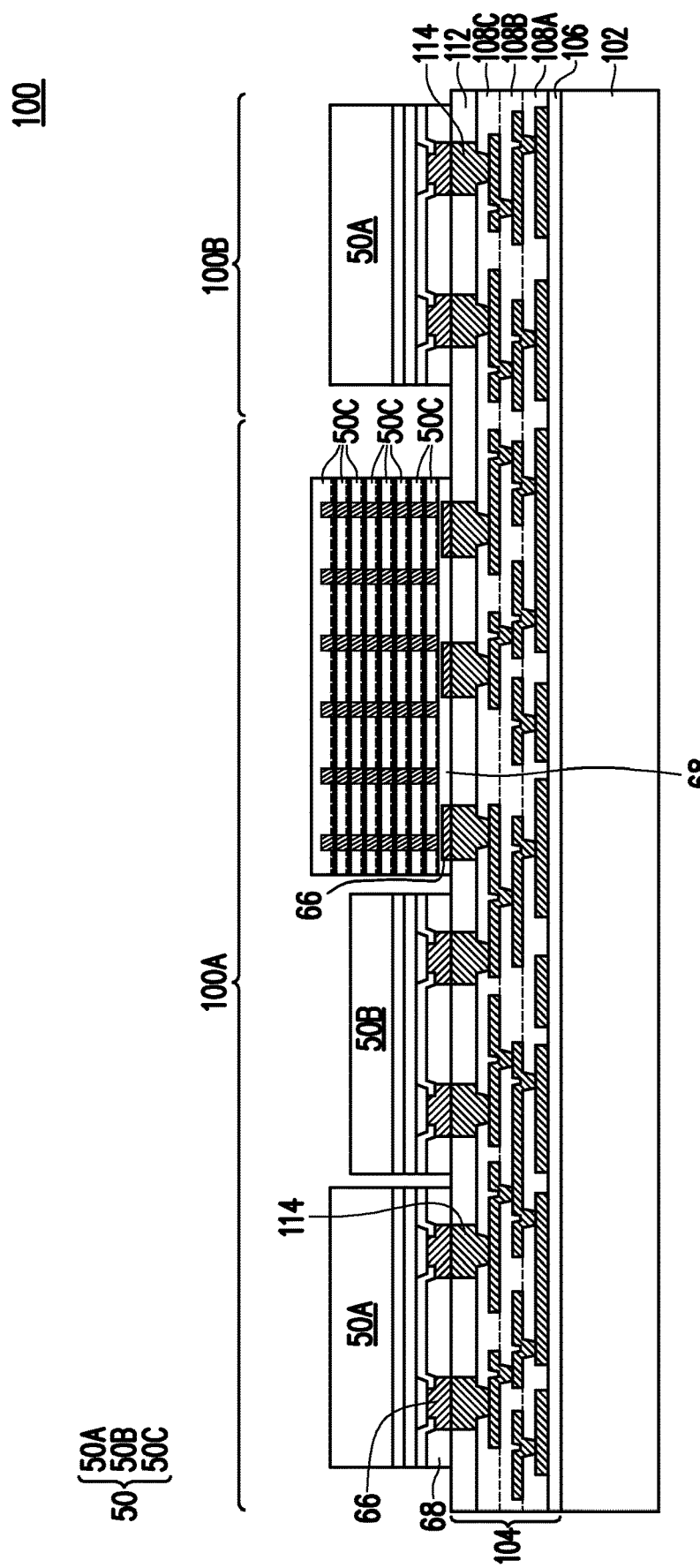

In FIG. 4, integrated circuit dies 50 (e.g., a first integrated circuit die 50A, a second integrated circuit die 50B, and a plurality of stacked integrated circuit dies 50C) are bonded to the redistribution structure 104 through the bonding pads 114 and the bonding layer 112. A desired type and quantity of integrated circuit dies 50 are adhered in each of the package regions 100A and 100B. In the embodiment shown, multiple integrated circuit dies 50 are adhered adjacent one another. The first and second integrated circuit dies 50A and 50B may be a logic device, such as a central processing unit (CPU), a graphics processing unit (GPU), a system-on-a-chip (SoC), a microcontroller, or the like. The plurality of stacked integrated circuit dies 50C (sometimes referred to as a die stack) may be a memory device, such as a dynamic random access memory (DRAM) die, a static random access memory (SRAM) die, a hybrid memory cube (HMC) module, a high bandwidth memory (HBM) module, or the like.

In some embodiments, the integrated circuit dies 50A and 50B may be the same type of dies, such as SoC dies. The first integrated circuit die 50A, the second integrated circuit die 50B, and the plurality of stacked integrated circuit dies 50C may be formed in processes of a same technology node, or may be formed in processes of different technology nodes. For example, the first integrated circuit die 50A may be of a more advanced process node than the second integrated circuit die 50B and/or the stacked integrated circuit dies 50C. The integrated circuit dies 50A and 50B may have different sizes (e.g., different heights and/or surface areas), or may have the same size (e.g., same heights and/or surface areas). Other combinations of integrated circuit dies (e.g., with or without stacked dies) are also possible in other embodiments.

The integrated circuit dies 50A and 50B and the stacked integrated circuit dies 50C are bonded to the redistribution structure 104, for example, in a hybrid bonding configuration. The integrated circuit dies 50 are disposed face down such that the front sides of the integrated circuit dies 50 face the redistribution structure 104 and the back sides of the integrated circuit dies 50 face away from the redistribution structure 104. The dielectric layers 68 of the integrated circuit dies 50 may be directly bonded to the bonding layer 112, and the die connectors 66 of the integrated circuit dies 50 may be directly bonded to the bonding pads 114. In an embodiment, the bonds between the dielectric layers 68 and the bonding layer 112 are oxide-to-oxide bonds, or the like. The hybrid bonding process further directly bonds the die connectors 66 of the integrated circuit dies 50 to the bonding pads 114 through direct metal-to-metal bonding. Thus, electrical connection can between the integrated circuit dies 50 and the redistribution structure 104 is provided by the physical and electrical connection of the die connectors 66 and the bonding pads 114. In some embodiments, the interface also includes dielectric-to-metal interfaces between the integrated circuit dies 50 and the redistribution structure 104 (e.g., where the die connectors 66 and the bonding pads 114 are not perfectly aligned and/or have different widths).

As an example, the hybrid bonding process starts with applying a surface treatment to one or more of the dielectric layers 68 or the bonding layer 112. The surface treatment may include a plasma treatment. The plasma treatment may be performed in a vacuum environment. After the plasma treatment, the surface treatment may further include a cleaning process (e.g., a rinse with deionized water, or the like) that may be applied to one or more of the dielectric layers 68 or the bonding layer 112. The hybrid bonding process may then proceed to aligning the die connectors 66 to the bonding pads 114. When the integrated circuit dies 50 and the redistribution structure 104 are aligned, the die connectors 66 may overlap with the corresponding bonding pads 114. Next, the hybrid bonding includes a pre-bonding step, during which each integrated circuit die 50 is put in contact with the bonding layer 112 and respective bonding pads 114. The pre-bonding may be performed at room temperature (e.g., between about 21° C. and about 25° C.). The hybrid bonding process continues with performing an anneal, for example, at a temperature between about 150° C. and about 400° C. for a duration between about 0.5 hours and about 3 hours, so that the metal in die connectors 55 (e.g., copper) and the metal of the bonding pads 114 (e.g., copper) inter-diffuses to each other, and hence the direct metal-to-metal bonding is formed. Other direct bonding processes (e.g., using adhesives, polymer-to-polymer bonding, or the like) may be used in other embodiments.

Notably, the integrated circuit dies 50 are bonded to the redistribution structure 104 without the use of solder connections (e.g., microbumps or the like). By directly bonding the integrated circuit dies 50 to the redistribution structure 104, advantages can be achieved, such as, finer bump pitch; small form factor packages by using hybrid bonds; smaller bonding pitch scalability for chip I/O to realize high density die-to-die interconnects; improved mechanical endurance; improved electrical performance; reduced defects; and increased yield. Further, shorter die-to-die may be achieved between the integrated circuit dies 50 and has the benefits of smaller form-factor, higher bandwidth, improved power integrity (PI), improved signal integrity (SI), and lower power consumption.

Figure 5:
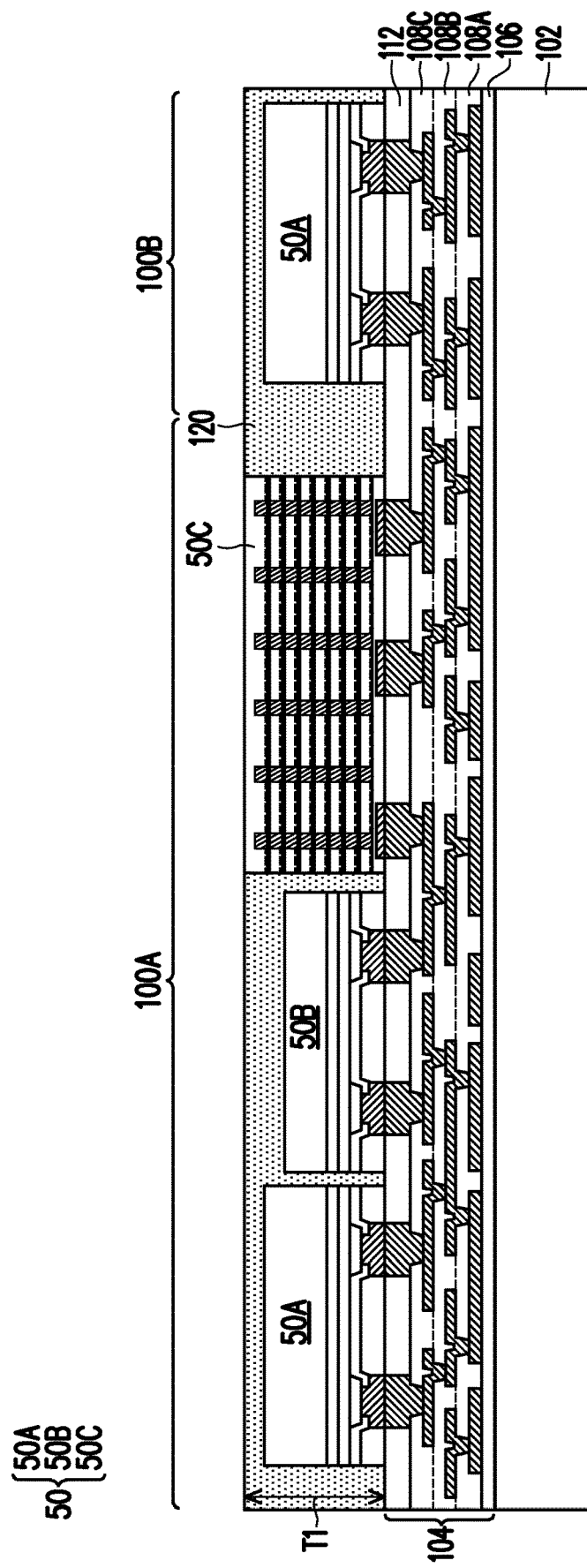

In FIG. 5, an encapsulant 120 is formed on and around the various components. After formation, the encapsulant 120 encapsulates the integrated circuit dies 50, and the encapsulant 120 may contact a top surface of the bonding layer 112. The encapsulant 120 may be a molding compound, epoxy, or the like. The encapsulant 120 may be applied by compression molding, transfer molding, or the like, and may be formed over the redistribution structure 104 such that the integrated circuit dies 50 are buried or covered. The encapsulant 120 is further formed in gap regions between the integrated circuit dies 50. The encapsulant 120 may be applied in liquid or semi-liquid form and then subsequently cured.

After the encapsulant 120 is formed, a planarization process is performed on the encapsulant 120 to one or more of the integrated circuit dies 50 (e.g., the stacked integrated circuit dies 50C). The planarization process may also remove material of the integrated circuit dies 50 that are exposed while other ones of the integrated circuit dies (e.g., the integrated circuit dies 50A and 50B) may remain buried in the encapsulant 120 after planarization. A top surface of the encapsulant 120 is substantially coplanar after the planarization process within process variations. The planarization process may be, for example, a chemical-mechanical polish (CMP), a grinding process, or the like. In some embodiments, the planarization may be omitted. After the planarization process, the encapsulant 120 may have a thickness T1 in a range of about 50 μm to about 1000 μm, or of about 300 μm to about 500 μm. The thickness T1 may correspond to a maximum standoff height of the integrated circuit dies 50, and the thickness T1 may be advantageously reduced in the described embodiments as a result of bonding the integrated circuit dies 50 to the redistribution structure 104 without solder connections.

Figure 6:
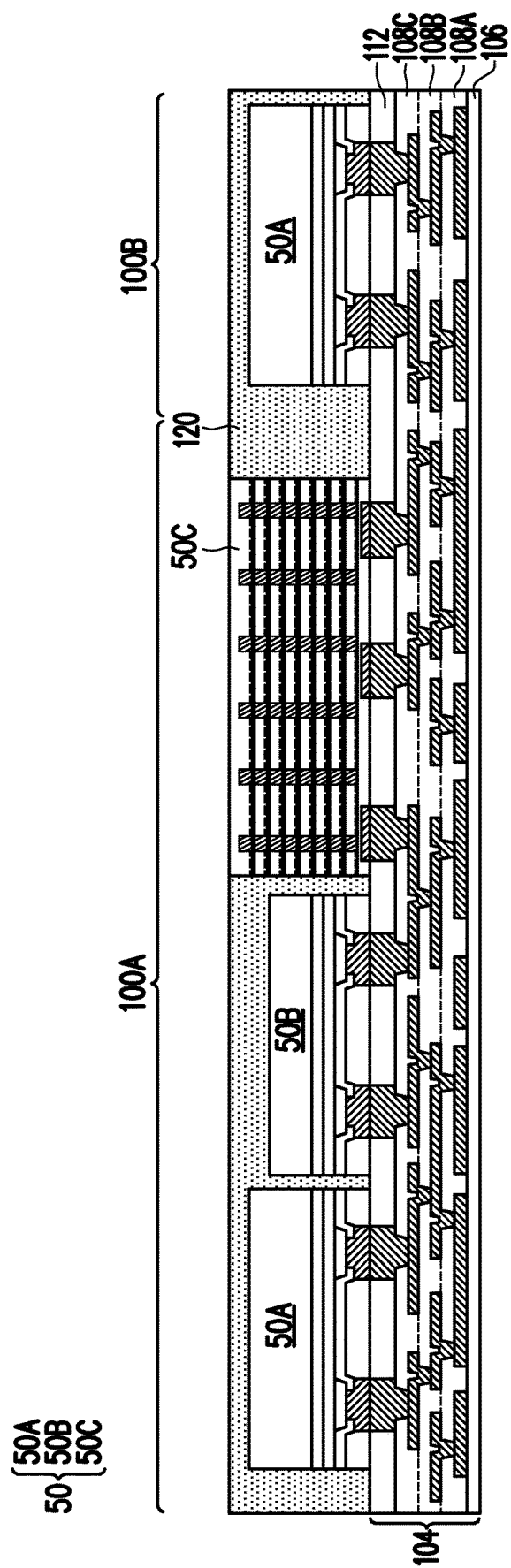

In FIG. 6, the substrate 102 is removed to expose the dielectric layer 106 of the redistribution structure 104. Removing the substrate 102 may be performed using any suitable process, such as a grinding process, a CMP process, an etch back process, combinations thereof or the like. A temporary handle (not explicitly illustrated), such as a glass carrier substrate or the like, may be attached to a surface of the encapsulant 120 opposite to the redistribution structure 104 by a die attach film (DAF), or the like. The temporary handle may be subsequently removed after the redistribution structure 104 is bonded to another device component such as package substrate 200, see FIG. 9.

Figure 7:
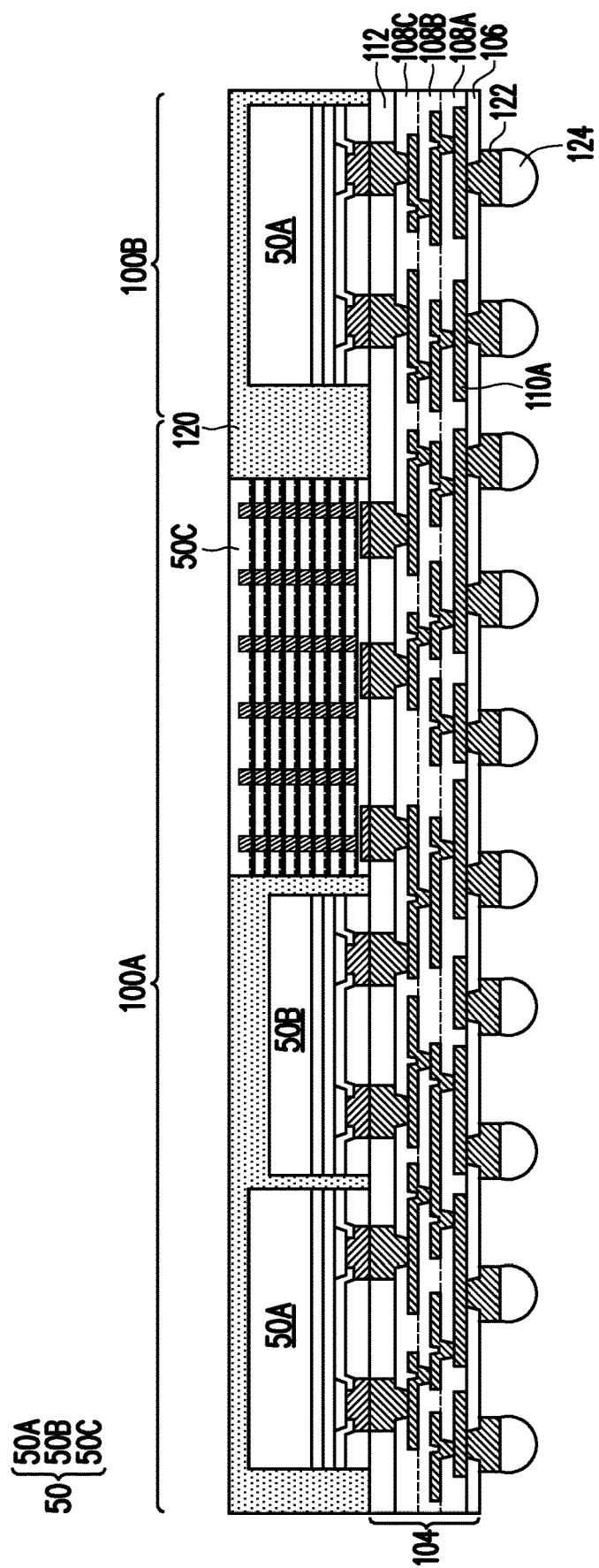

In FIG. 7, under bump metallizations (UBMs) 122 are formed for external connection to the redistribution structure 104. The UBMs 122 have bump portions on and extending along the major surface of the dielectric layer 106, and have via portions extending through the dielectric layer 106 to physically and electrically couple the metallization pattern 110A. As a result, the UBMs 122 are electrically coupled to the integrated circuit dies 50.

As an example of forming the UBMs 122, openings are formed through the dielectric layer 106 to expose portions of the metallization pattern 110A. The openings may be formed, for example, using laser drilling, etching, or the like. The conductive UBMs 122 are formed in the openings. In some embodiments, the UBMs 122 comprise flux and are formed in a flux dipping process. In some embodiments, the UBMs 122 comprise a conductive paste such as solder paste, silver paste, or the like, and are dispensed in a printing process. In some embodiments, the UBMs 122 are formed in a manner similar to the metallization pattern 110A, and may be formed of a similar material as the metallization pattern 110A. In some embodiments, the UBMs 122 have a different size than the metallization patterns 110A, 110B, and 110C. For example, the UBMs 122 may be thicker than the metallization patterns 110A, 110B, and/or 110C.

Also illustrated in FIG. 7, conductive connectors 124 are formed on the UBMs 122. The conductive connectors 124 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 124 may include a conductive material such as solder, copper, aluminum, gold, nickel, silver, palladium, tin, the like, or a combination thereof. In some embodiments, the conductive connectors 124 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 124 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 8:
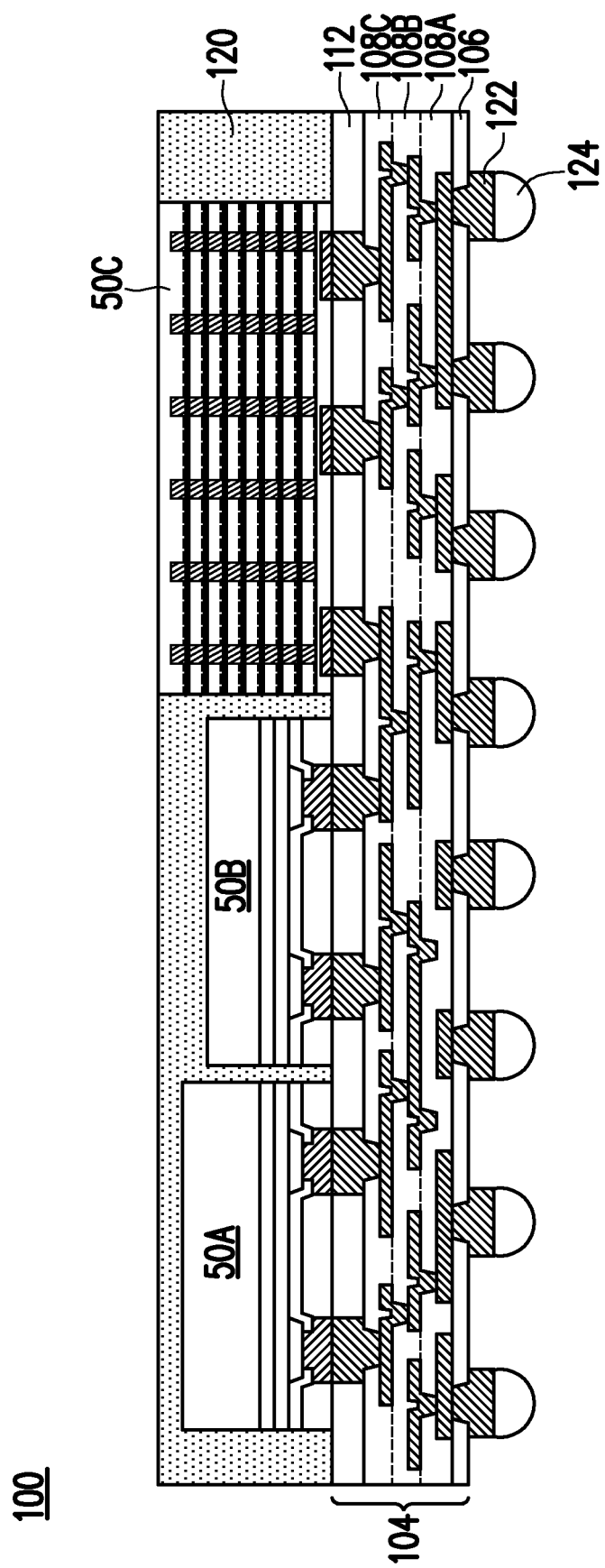

In FIG. 8, a singulation process is performed by sawing along scribe line regions, e.g., between the first package region 100A and the second package region 100B. The sawing singulates the first package region 100A from the second package region 100B. The resulting, singulated device 100 is from one of the first package region 100A or the second package region 100B.

Figure 9:
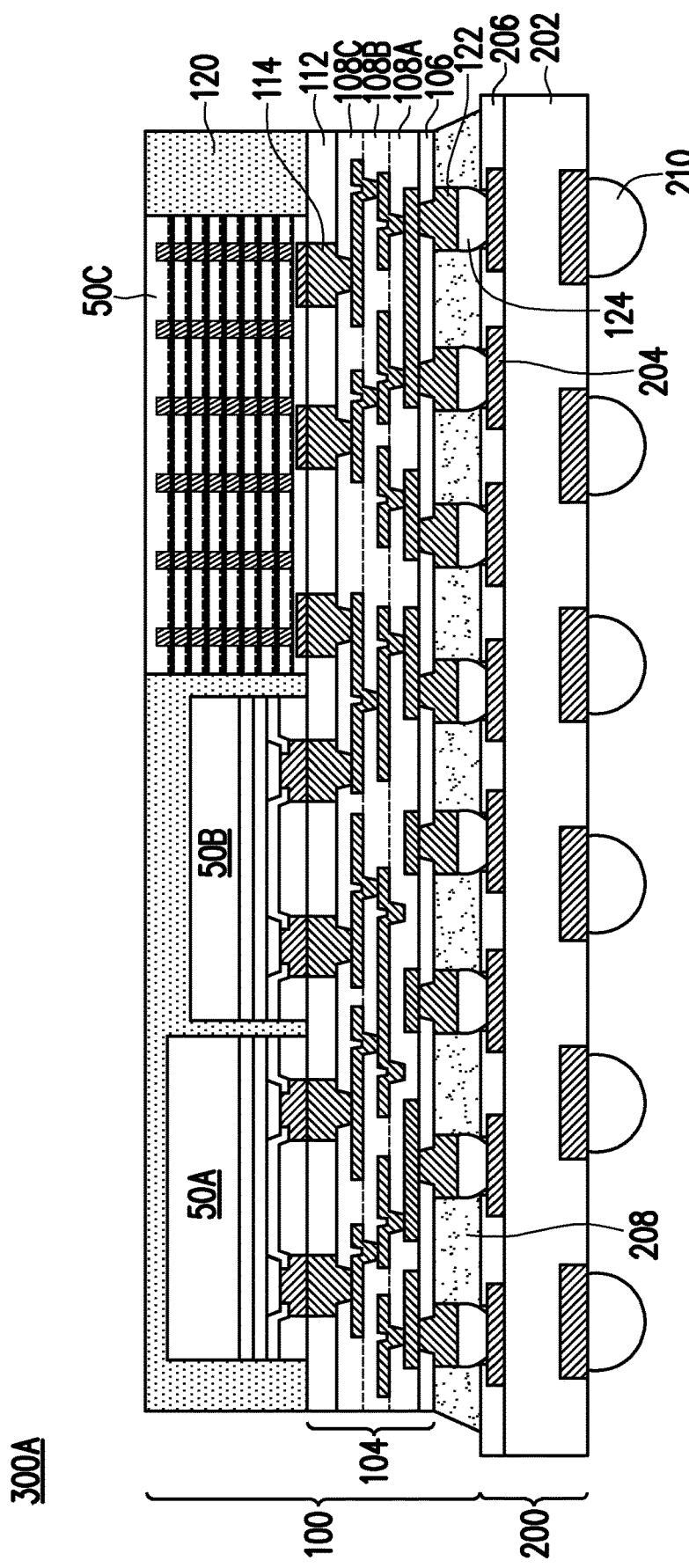

In FIG. 9, each singulated first package component 100 may be mounted to a package substrate 200 using the conductive connectors 124. The package substrate 200 includes a substrate core 202 and bond pads 204 over the substrate core 202. The substrate core 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 202 may be an SOI substrate. Generally, an SOI substrate includes a layer of a semiconductor material such as epitaxial silicon, germanium, silicon germanium, SOI, SGOI, or combinations thereof. The substrate core 202 is, in one alternative embodiment, based on an insulating core such as a fiberglass reinforced resin core. One example core material is fiberglass resin such as FR4. Alternatives for the core material include bismaleimidetriazine (BT) resin, or alternatively, other PCB materials or films. Build up films such as ABF or other laminates may be used for substrate core 202.

The substrate core 202 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 202 may also include metallization layers and vias (not shown), with the bond pads 204 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 202 is substantially free of active and passive devices. Conductive connectors 210 (e.g., ball grid array (BGA) balls, or the like) may be disposed on a surface of the substrate core 202 opposite the first package component 100. The conductive connectors 210 may allow the package substrate 200 to be attached to another component, such as, a motherboard, a printed circuit board (PCB), or the like.

In some embodiments, the conductive connectors 124 are reflowed to attach the first package component 100 to the bond pads 204. The conductive connectors 124 electrically and/or physically couple the package substrate 200, including metallization layers in the substrate core 202, to the first package component 100. In some embodiments, a solder resist 206 is formed on the substrate core 202. The conductive connectors 124 may be disposed in openings in the solder resist 206 to be electrically and mechanically coupled to the bond pads 204. The solder resist 206 may be used to protect areas of the substrate 202 from external damage.

The conductive connectors 124 may have an epoxy flux (not shown) formed thereon before they are reflowed with at least some of the epoxy portion of the epoxy flux remaining after the first package component 100 is attached to the package substrate 200. This remaining epoxy portion may act as an underfill to reduce stress and protect the joints resulting from reflowing the conductive connectors 124. In some embodiments, an underfill 208 may be formed between the first package component 100 and the package substrate 200 and surrounding the conductive connectors 124. The underfill 208 may be formed by a capillary flow process after the first package component 100 is attached or may be formed by a suitable deposition method before the first package component 100 is attached. Thus, a package 300A is formed comprising the first package component 100 and the package substrate 200.

The first package component 100 may be implemented in other device stacks. For example, a chip on wafer on substrate structure is shown, but the first package component 100 may also be implemented in a Package on Package (PoP) configuration (e.g., with an integrated fan-out (InFO) configuration), a Flip Chip Ball Grid Array (FCBGA) package, or the like. Optionally, a lid or heat spreader (not specifically illustrated) may be attached to a surface of the first package component 100 opposite to the substrate.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 10:
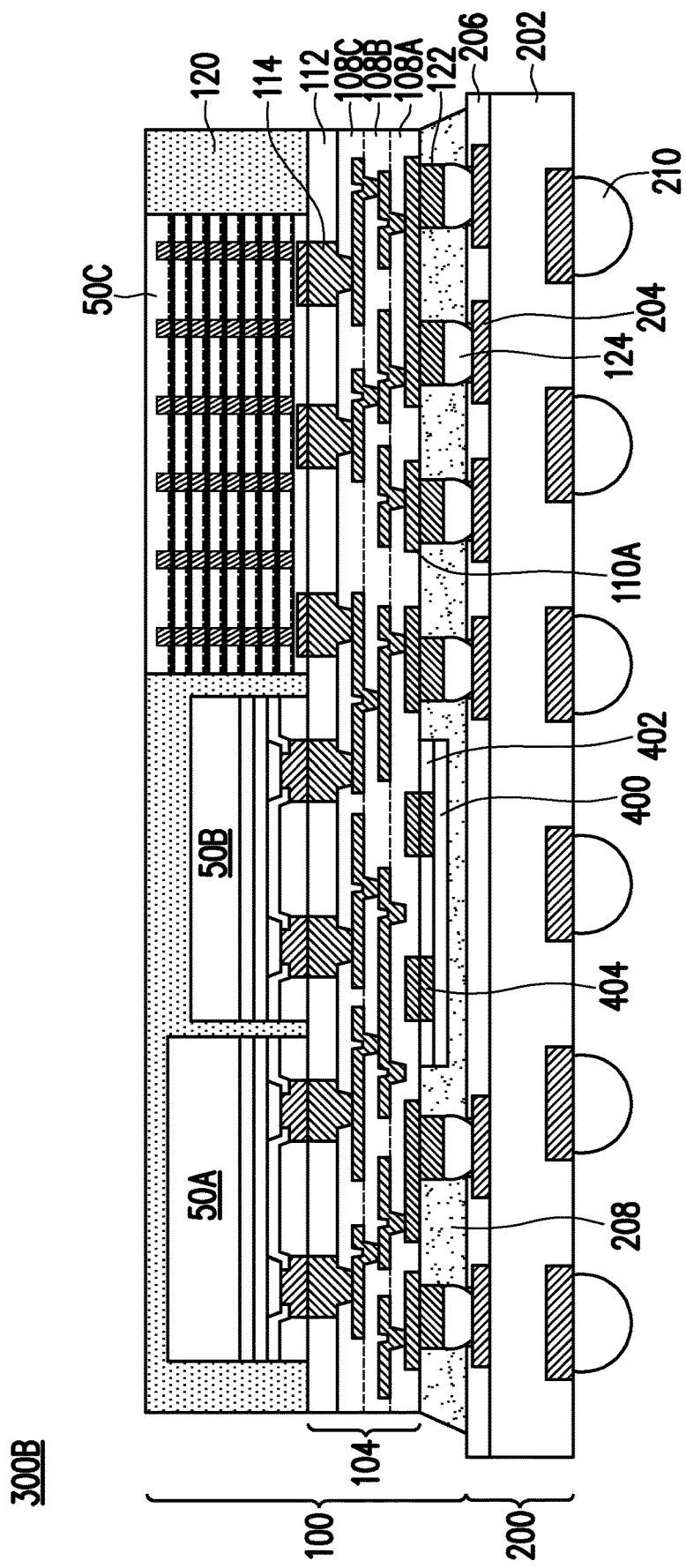
FIG. 10 illustrates a cross-sectional view of a package in accordance with some embodiments.

In some embodiments, passive devices (e.g., surface mount devices (SMDs), or the like) may also be attached to the first package component 100 (e.g., to the UBMs 122) or to the package substrate 200 (e.g., to the bond pads 204). For example, FIG. 10 illustrates a cross-sectional view of a package 300B having passive devices according to some embodiments. The package 300B may be similar to the package 300A where like reference numerals indicate like elements formed by like processes. The passive devices 400 may be surface mount devices (SMDs), or the like and comprise one or more capacitors, inductors, resistors, the like, or combinations thereof. The passive devices 400 may be substantially free of any active devices. The passive devices 400 may be bonded to the metallization pattern 110A of the redistribution structure 104 using a hybrid bonding process (e.g., similar to that described above with respect to bonding the integrated circuit dies 50 to the redistribution structure 104). Specifically, a bonding layer 402 of the passive device 400 may be directly bonded to the dielectric layer 108A of the redistribution structure 104 using dielectric-to-dielectric bonds, and bonding pads 404 of the passive device 400 may be directly bonded to the metallization pattern 110A using metal-to-metal bonds. The bonding layer 402 and the bonding pads 404 may be formed of a similar material and of a similar process as the bonding layer 112 and the bonding pads 114, respectively. The passive devices 400 may be bonded without solder connections (e.g., microbumps or the like) to achieve a smaller form factor in the resulting package 300B. In some embodiments, the dielectric layer 106 may be removed after removing the substrate 102 to expose the metallization pattern 110A. In other embodiments, the passive devices 400 may be bonded to the metallization pattern 110A of the redistribution structure 104 in a flip chip bonding process, for example, by reflowing solder connections between the passive devices 400 and the metallization pattern 110A.

FIGS. 11 through 15 illustrate cross-sectional views of intermediate steps of forming a package 500A according to some embodiments. In FIGS. 11 through 14, a second package component 150 is formed. A first package region 150A and a second package region 150B are illustrated, and one or more of the integrated circuit dies 50 are packaged to form an integrated circuit package in each of the package regions 150A and 150B. The second package component 150 may be similar to the first package component 100 where like reference numerals indicate like elements formed by like processes.

Figure 11:
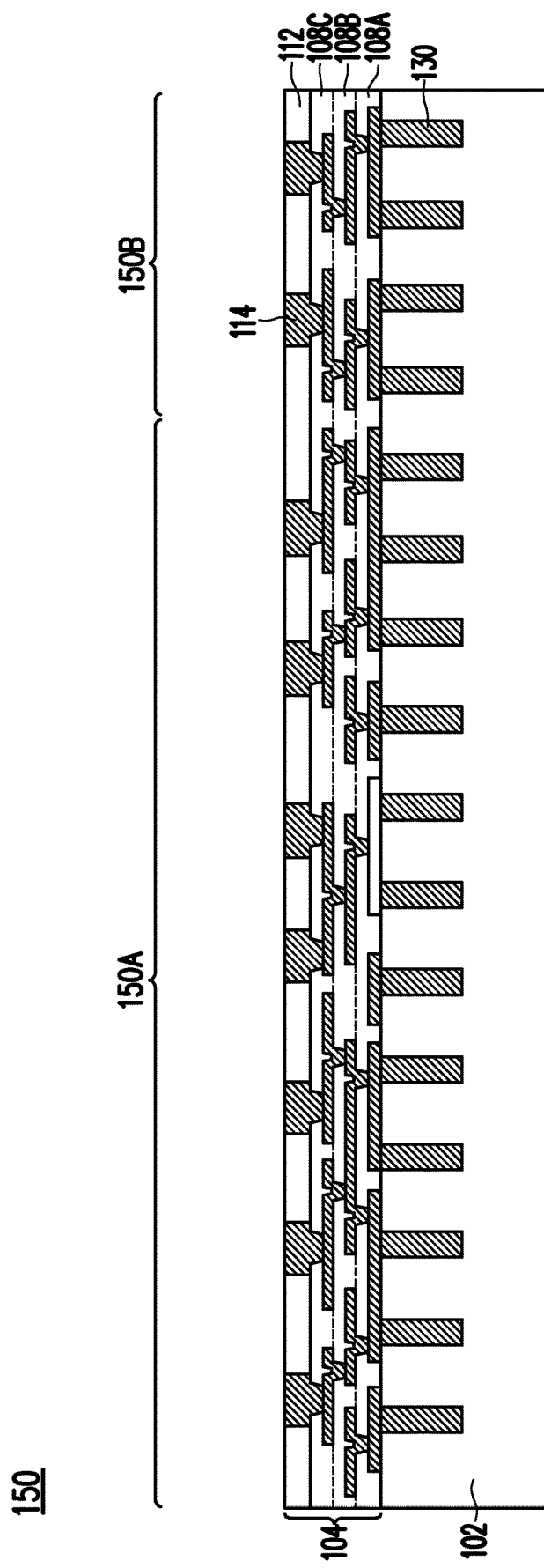
FIGS. 11 through 16 illustrate cross-sectional views of intermediate steps during a process for forming a semiconductor package in accordance with some embodiments.

FIG. 11 illustrates the substrate 102 with the redistribution structure 104 formed thereon using similar processes as described above. The substrate 102 may include through substrate vias (TSVs) 130, which may be electrically connected to the metallization patterns in the redistribution structure 104. The through vias 130 may comprise a conductive material (e.g., copper, or the like) and may extend from the redistribution structure 104 into the substrate 102. Insulating barrier layers (not separately illustrated) may be formed around at least portions of the through vias 130 in the substrate 102. The insulating barrier layers may comprise, for example, silicon oxide, silicon nitride, silicon oxynitride, or the like, and may be used to physically and electrically isolate the through vias 130 from the substrate 102. In subsequent processing steps, the substrate 102 may be thinned to expose the through vias 130 (see FIG. 13). After thinning, the through vias 130 provide electrical connection from a back side of the substrate 102 to a front side of the substrate 102.

Figure 12:
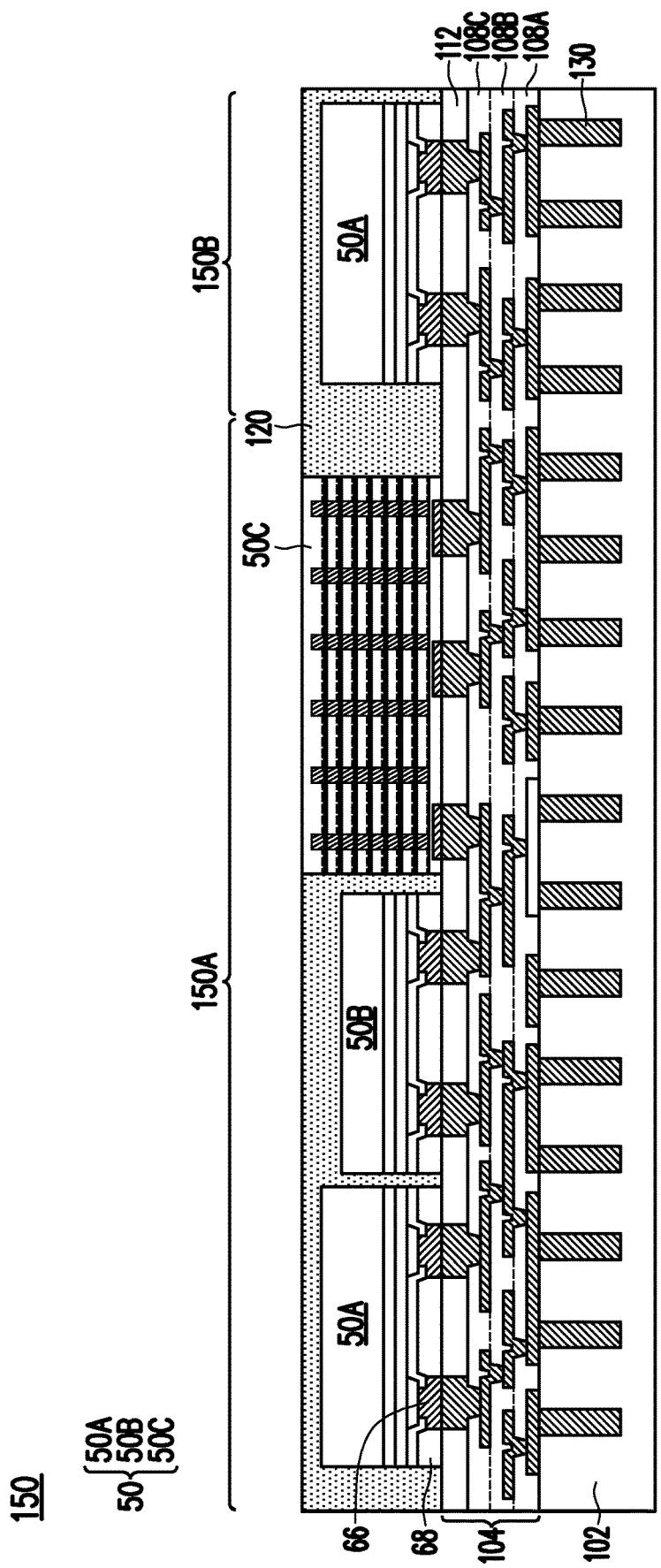

In FIG. 12, integrated circuit dies 50 (e.g., the first integrated circuit dies 50A, the second integrated circuit dies, and the plurality of stacked integrated circuit dies 50C) are bonded to the redistribution structure 104 using, for example, a hybrid bonding process as described above. By directly bonding the integrated circuit dies 50 to the redistribution structure 104, advantages can be achieved, such as, finer bump pitch; small form factor packages by using hybrid bonds; smaller bonding pitch scalability for chip I/O to realize high density die-to-die interconnects; improved mechanical endurance; improved electrical performance; reduced defects; and increased yield. Further, shorter die-to-die may be achieved between the integrated circuit dies 50, which have the benefits of smaller form-factor, higher bandwidth, improved power integrity (PI), improved signal integrity (SI), and lower power consumption. Further illustrated by FIG. 12, the encapsulant 120 is formed around the integrated circuit dies 150 as described above.

Figure 13:
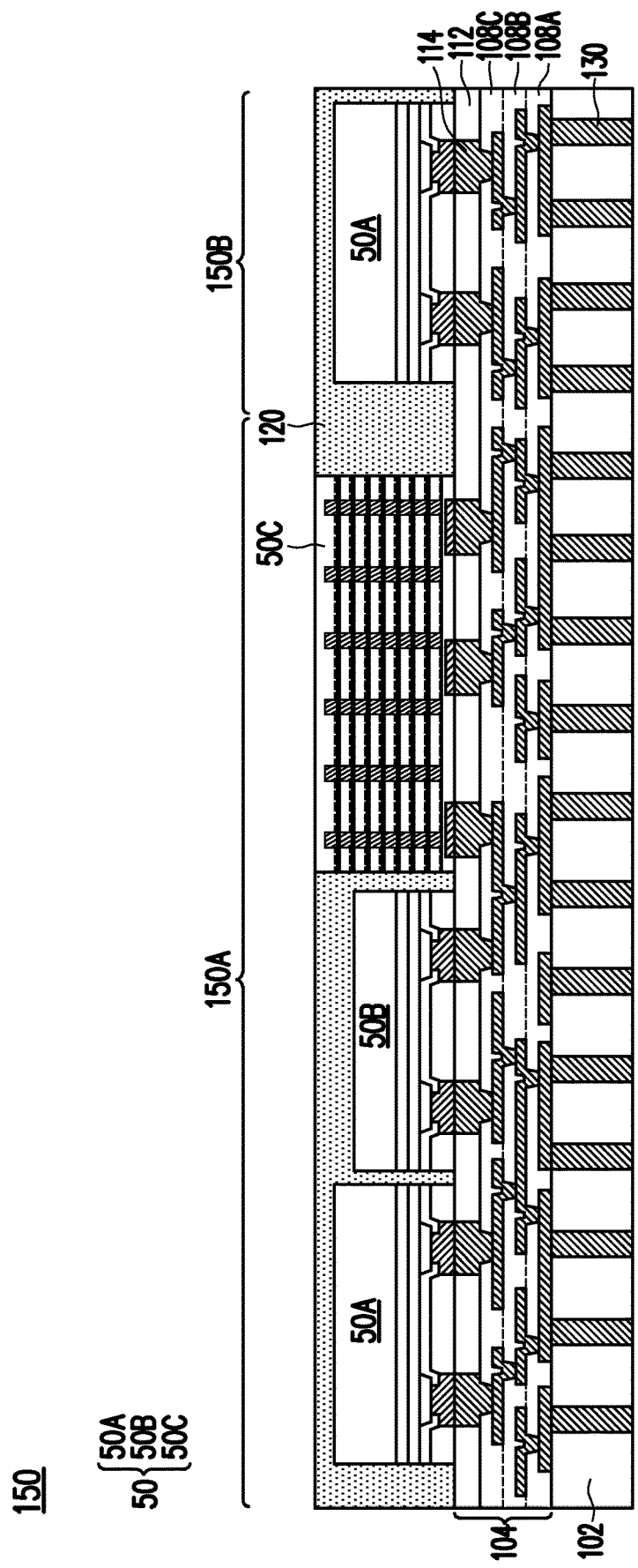

In FIG. 13, a planarization process is applied to the substrate 102 to expose the through vias 130. The planarization may remove portions of the substrate 102 opposite to the redistribution structure 104 such that the through vias 130 are exposed. The planarization may be achieved by any suitable process, such as, grinding, CMP, etch back, the like, or combinations thereof. After the planarization, the through vias 130 extend completely through the substrate 120 and provide interconnection from the redistribution structure 104 to a surface of the substrate 120 opposite the redistribution structure 104.

Figure 14:
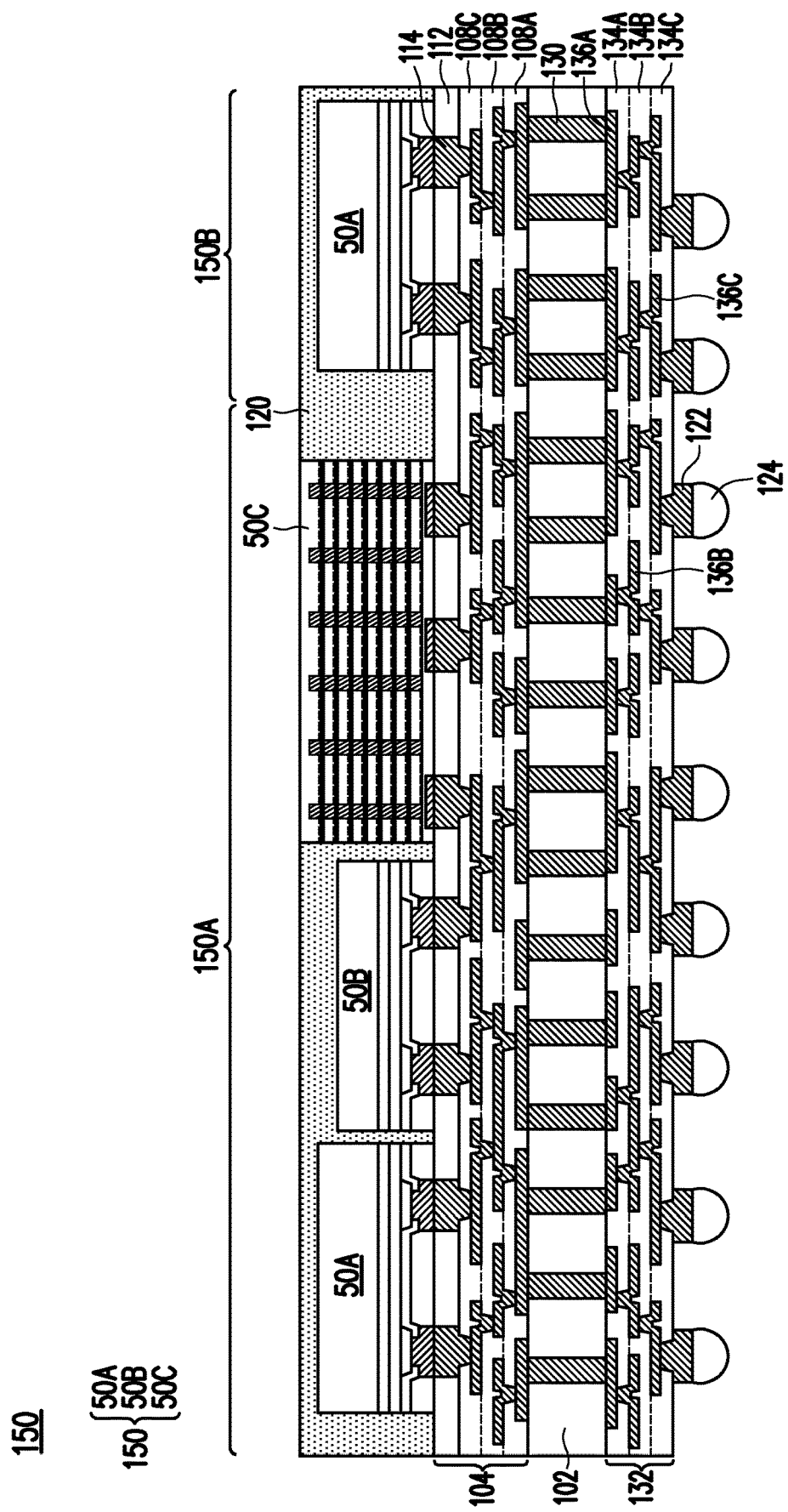

In FIG. 14, a redistribution structure 132 is formed on a side of the substrate 102 opposite to the redistribution structure 104. The redistribution structure 132 includes dielectric layers 134 (labelled 134A, 134B, and 134C) and metallization patterns 136 (sometimes referred to as redistribution layers or redistribution lines, labeled 136A, 136B and 136C). The dielectric layers 134 and the metallization patterns 136 may be made of a similar material and using a similar process as the dielectric layers 108 and the metallization patterns 110, respectively. The metallization patterns 136 may be electrically connected to the metallization patterns 110 by the through vias 130. Although FIG. 14 illustrates the redistribution structure 132 as having a particular number of dielectric layers 134 and metallization patterns 136, it should be appreciated that the redistribution structure 132 may be have a different number of dielectric layers 132 and/or metallization patterns 136 in other embodiments. Further, the number of dielectric layers and metallization patterns in the redistribution structure 132 may be the same or different than the number of dielectric layers and metallization patterns in the redistribution structure 104. The completed redistribution structure 132 may be free of any active devices and/or free of any passive devices, and the carrier substrate 102, the redistribution structure 104, and the redistribution structure 132 may be collectively referred to as an interposer.

Also illustrated in FIG. 14, the UBMs 122 and the conductive connectors 124 may be formed on the redistribution structure 132. For example, the UBMs 122 and the conductive connectors 124 may be formed on the metallization pattern 136C of the redistribution structure 132 using a similar material and with a similar process as described above.

Figure 15:
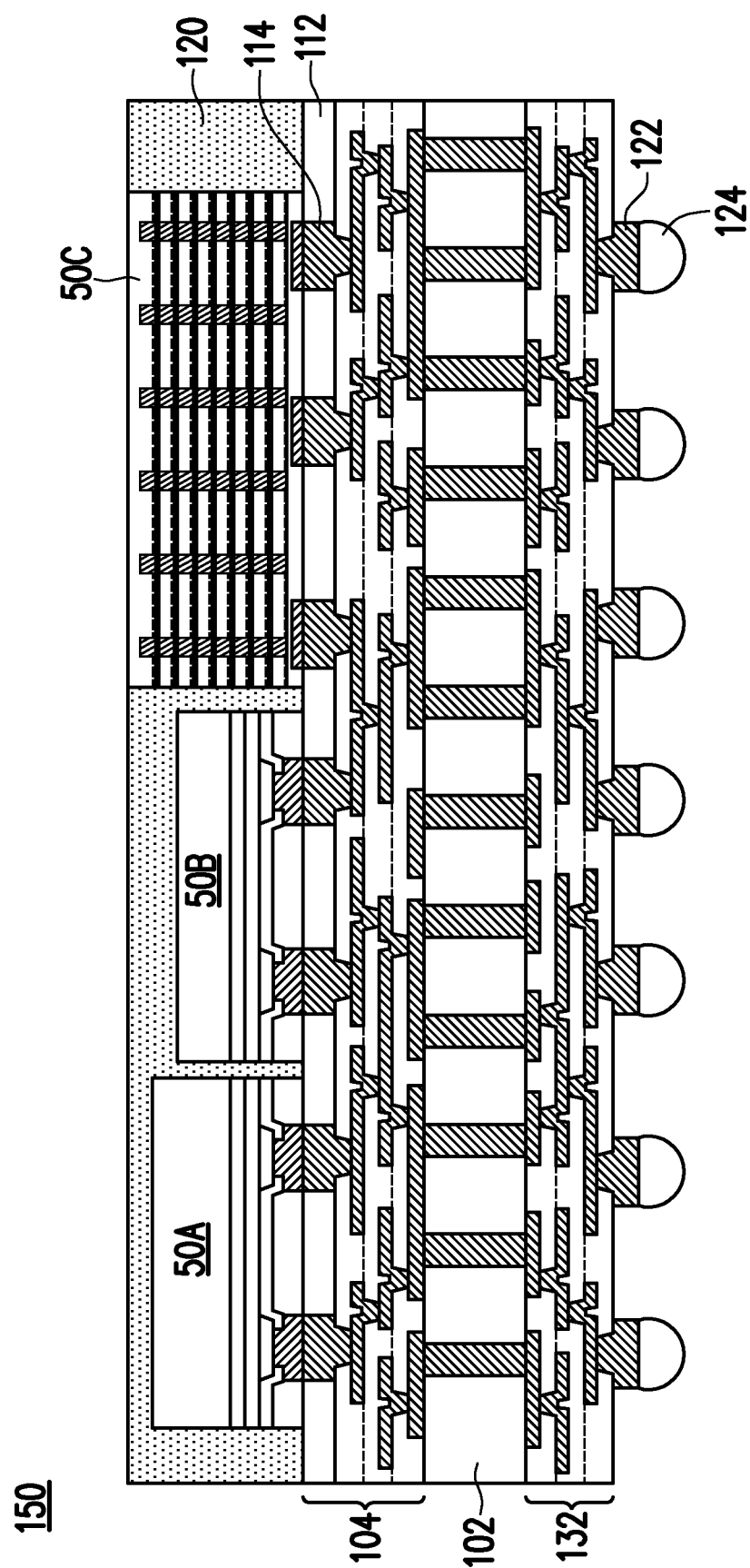

In FIG. 15, a singulation process is performed by sawing along scribe line regions, e.g., between the first package region 150A and the second package region 150B. The sawing singulates the first package region 150A from the second package region 150B. The resulting, singulated device 150 is from one of the first package region 150A or the second package region 150B.

Figure 16:
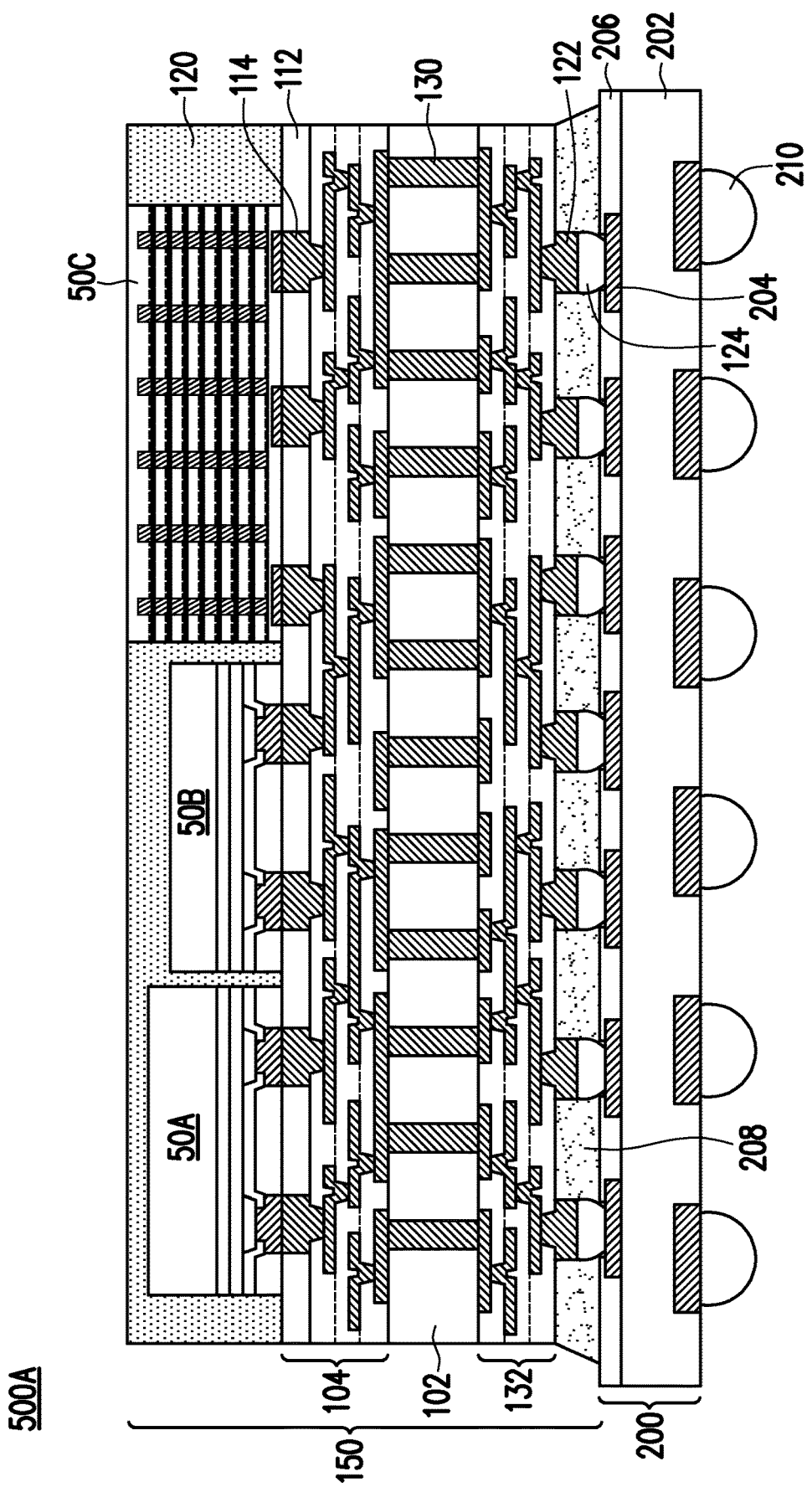
Figure 17:
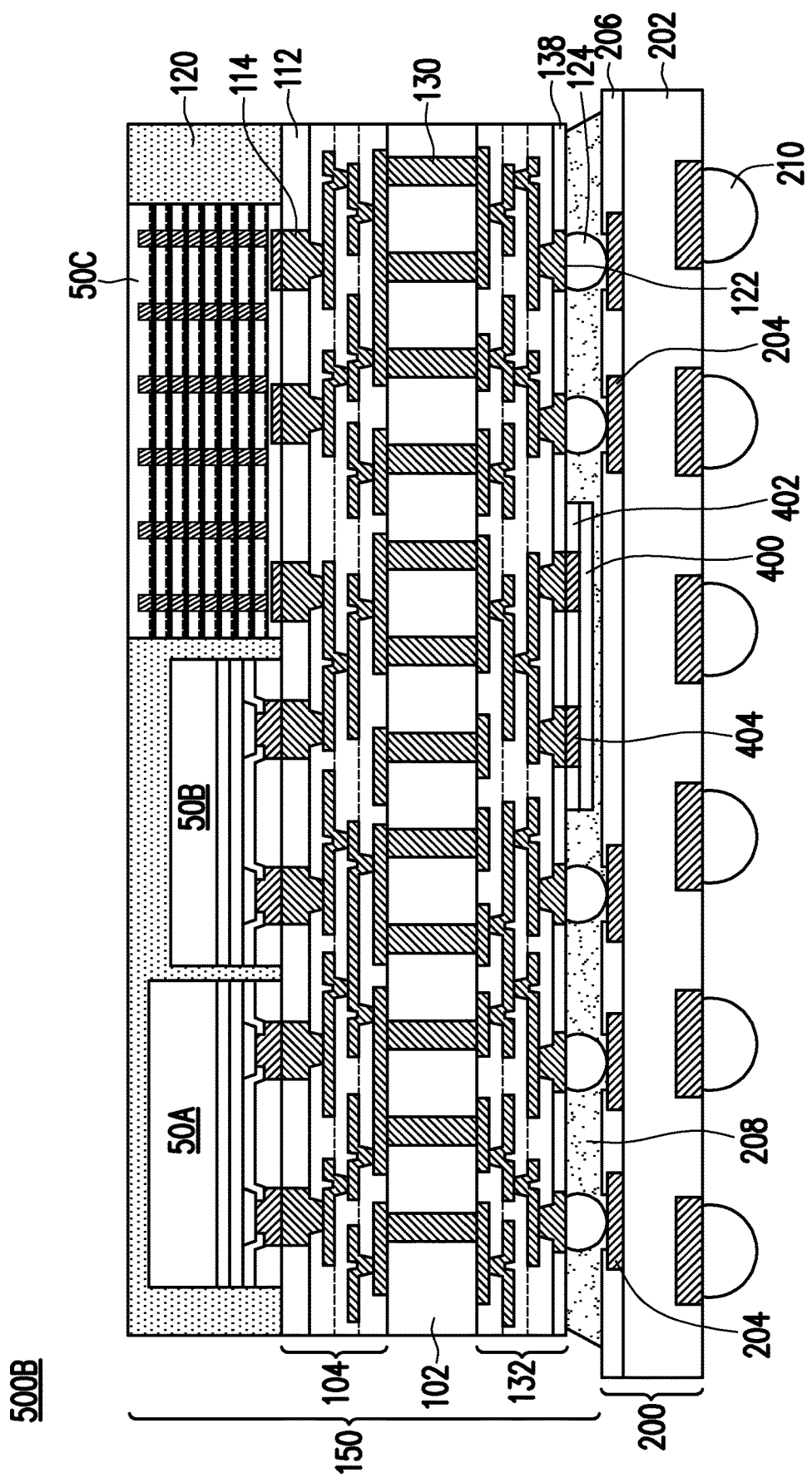
FIG. 17 illustrates a cross-sectional view of a package in accordance with some embodiments.

In FIG. 16, each singulated the second package component 150 may be mounted to a package substrate 200 using the conductive connectors 124. The package substrate 200 includes a substrate core 202, bond pads 204 over the substrate core 202, and conductive connectors 210 on an opposite side of the substrate core 202 as the second package component 150 as described above.

In some embodiments, the conductive connectors 124 are reflowed to attach the second package component 150 to the bond pads 204. The conductive connectors 124 electrically and/or physically couple the package substrate 200, including metallization layers in the substrate core 202, to the second package component 150. In some embodiments, a solder resist 206 is formed on the substrate core 202. The conductive connectors 124 may be disposed in openings in the solder resist 206 to be electrically and mechanically coupled to the bond pads 204. The solder resist 206 may be used to protect areas of the substrate 202 from external damage.

The conductive connectors 124 may have an epoxy flux (not shown) formed thereon before they are reflowed with at least some of the epoxy portion of the epoxy flux remaining after the second package component 150 is attached to the package substrate 200. This remaining epoxy portion may act as an underfill to reduce stress and protect the joints resulting from reflowing the conductive connectors 124. In some embodiments, an underfill 208 may be formed between the second package component 150 and the package substrate 200 and surrounding the conductive connectors 124. The underfill 208 may be formed by a capillary flow process after the second package component 150 is attached or may be formed by a suitable deposition method before the second package component 150 is attached. Thus, a package 500A is formed comprising the second package component 150 and the package substrate 200.

The second package component 150 may be implemented in other device stacks. For example, a chip on wafer on substrate structure is shown, but the first package component 100 may also be implemented in a PoP configuration (e.g., with InFO configuration), a FCBGA package, or the like. Optionally, a lid or heat spreader (not specifically illustrated) may be attached to a surface of the second package component 150 opposite to the substrate 200.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, passive devices (e.g., surface mount devices (SMDs), or the like) may also be attached to the second package component 150 (e.g., to the UBMs 122) or to the package substrate 200 (e.g., to the bond pads 204). For example, FIG. 16 illustrates a cross-sectional view of a package 500B having passive devices according to some embodiments. The package 500B may be similar to the package 500A where like reference numerals indicate like elements formed by like processes. The passive devices 400 may be surface mount devices (SMDs), or the like and comprise one or more capacitors, inductors, resistors, the like, or combinations thereof. The passive devices 400 may be substantially free of any active devices. The passive devices 400 may be bonded to the metallization pattern 136C of the redistribution structure 132 using a hybrid bonding process (e.g., similar to that described above with respect to bonding the integrated circuit dies 50 to the redistribution structure 104). Specifically, a bonding layer 138 may be formed around the UBMs 122. The bonding layer 132 may be formed of a similar material and using a similar process as the bonding layer 112. A planarization process may be applied to level surfaces of the bonding layer 138 with the UBMs 122. Subsequently, a bonding layer 402 of the passive device 400 may be directly bonded to the bonding layer 138 of the redistribution structure 132 using dielectric-to-dielectric bonds, and bonding pads 404 of the passive device 400 may be directly bonded to the UBMs 122 using metal-to-metal bonds. The bonding layer 402 and the bonding pads 404 may be formed of a similar material and of a similar process as the bonding layer 112 and the bonding pads 114, respectively. The passive devices 400 may be bonded without solder connections (e.g., microbumps or the like) to achieve a smaller form factor in the resulting package 300B. In other embodiments, the passive devices 400 may be bonded to the UBMs 122 of the redistribution structure 132 in a flip chip bonding process, for example, by reflowing solder connections (e.g., microbumps or the like) between the passive devices 400 and the UBMs 122.

Various embodiments include an interposer structure with semiconductor dies and/or die stacks directly bonded thereto. For example, a hybrid bonding process may be used to form direct metal-to-metal and direct insulator-to-insulator bonds between the interposer structure and other package components (the semiconductor dies and/or die stacks). Interconnections between the semiconductor dies and/or die stacks may be provided through the hybrid bonds and the interposer. Various embodiments may achieve one or more of the following, non-limiting advantages: finer bump pitch; small form factor (SFF) packages by using hybrid bonds; smaller bonding pitch scalability for chip I/O to realize high density die-to-die interconnects; improved mechanical endurance; improved electrical performance; reduced defects; and increased yield. Further, short die-to-die connection has the benefits of smaller form-factor, higher bandwidth, improved power integrity (PI), improved signal integrity (SI), and lower power consumption.

In some embodiments, a package includes an interposer, wherein the interposer comprises a first redistribution structure; a first die bonded to a first surface of the first redistribution structure with a dielectric-to-dielectric bond and a metal-to-metal bond; a second die bonded to the first surface of the first redistribution structure with a dielectric-to-dielectric bond and a metal-to-metal bond; an encapsulant around the first die and the second die; and a plurality of conductive connectors on a second side of the first redistribution structure opposite to the first die and the second die. Optionally, in some embodiments, the package further includes a plurality of stacked dies, wherein the plurality of stacked dies is directly bonded to the first surface of the first redistribution structure with a dielectric-to-dielectric bond and a metal-to-metal bond. Optionally, in some embodiments, the plurality of conductive connectors physically contacts a second surface of the first redistribution structure that is opposite to the first surface of the first redistribution structure. Optionally, in some embodiments, the package further includes a passive device die directly bonded to the second surface of the first redistribution structure with a dielectric-to-dielectric bond and a metal-to-metal bond. Optionally, in some embodiments, the interposer further comprises: a second redistribution structure; a semiconductor substrate between the first redistribution structure and the second redistribution structure; and a plurality of through vias in the semiconductor substrate, wherein the plurality of through vias electrically connect the first redistribution structure to the second redistribution structure. Optionally, in some embodiments, the plurality of conductive connectors contacts a third surface of the second redistribution structure that is opposite to the semiconductor substrate. Optionally, in some embodiments, the package further includes a passive device die directly bonded to the third surface of the second redistribution structure with a dielectric-to-dielectric bond and a metal-to-metal bond.

In some embodiments, a semiconductor package includes a plurality of first dielectric layers, each of the plurality of first dielectric layers having a first metallization pattern disposed therein; a bonding layer over the plurality of first dielectric layers; a plurality of bonding pads in the bonding layer; a first die comprising: a first insulating layer touching the bonding layer; and first conductive pads touching the plurality of bonding pads; a die stack comprising: a second insulating layer touching the bonding layer; and second conductive pads touching the plurality of bonding pads; and an encapsulant over the bonding layer, the encapsulant being disposed around the die stack and the first die. Optionally, in some embodiments, the package further includes a plurality of second dielectric layers, each of the plurality of second dielectric layers having a second metallization pattern disposed therein; a semiconductor substrate between the plurality of first dielectric layers and the plurality of second dielectric layers, wherein the semiconductor substrate is free of any active devices; and a plurality through vias extending through the semiconductor substrate. Optionally, in some embodiments, the package further includes an integrated passive device (IPD) bonded to an opposite side of the plurality of first dielectric layers as the first die and the die stack. Optionally, in some embodiments, the IPD is bonded to the opposite side of the plurality of first dialectic layers as the first die and the die stack without solder connections. Optionally, in some embodiments, the package further includes a package substrate bonded to a same surface as the IPD with a plurality of conductive connectors, wherein the IPD is between the package substrate and the same surface. Optionally, in some embodiments, the same surface is a surface of the plurality of first dielectric layers. Optionally, in some embodiments, the plurality of conductive connectors comprises solder.

In some embodiments, a method includes forming a first redistribution structure over a substrate, wherein the substrate is free of any active devices, and wherein the first redistribution structure comprises: a plurality of first metallization patterns in a plurality of a first dielectric layers; a bonding layer over the first plurality of metallization patterns; and a plurality of bonding pads in the bonding layer, wherein the plurality of bonding pads is electrically connected to the first plurality of metallization patterns. The method further includes bonding a first die to the first redistribution structure, wherein bonding the first die comprises directly bonding a first insulating layer of the first die to the bonding layer and directly bonding first die connectors of the first die to the plurality of bonding pads; bonding a second die to the first redistribution structure, wherein bonding the second die comprises directly bonding a second insulating layer of the second die to the bonding layer and directly bonding second die connectors of the second die to the plurality of bonding pads; and encapsulating the first die and the second die in a molding compound. Optionally, in some embodiments, the method further includes removing the substrate after encapsulating the first die and the second die in the molding compound. Optionally, in some embodiments, the substrate comprises a plurality of through vias electrically connected to the plurality of first metallization patterns, and wherein the method further comprises planarizing a surface of the substrate opposite to the first redistribution structure to expose the plurality of through vias. Optionally, in some embodiments, the method further includes forming a second redistribution structure on the surface of the substrate opposite to the first redistribution structure, wherein the second redistribution structure comprises a plurality of second metallization patterns in a plurality of second dielectric layers, and wherein the plurality of through vias electrically connect the plurality of first metallization patterns to the plurality of second metallization patterns. Optionally, in some embodiments, the method further includes bonding a integrated passive device (IPD) to a side of the first redistribution structure opposite to the first die and the second die without solder connectors. Optionally, in some embodiments, the second die is disposed in a die stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
an interposer, wherein the interposer comprises a first redistribution structure;
a first die bonded to a first surface of the first redistribution structure with a dielectric-to-dielectric bond and a metal-to-metal bond;
a second die bonded to the first surface of the first redistribution structure with a dielectric-to-dielectric bond and a metal-to-metal bond;
an encapsulant around the first die and the second die;
a second redistribution structure;
a semiconductor substrate between the first redistribution structure and the second redistribution structure, wherein the first surface of the first redistribution structure is opposite to the semiconductor substrate; and a plurality of solder balls contacting a second surface of the second redistribution structure that is opposite to the semiconductor substrate;
a passive device die directly bonded to the second surface of the second redistribution structure, wherein the plurality of solder balls extends farther from the interposer than the passive device die;
a package substrate comprising a plurality of contact pads directly bonded to the solder balls, wherein the plurality of contact pads are disposed in a solder resist;
an underfill around the plurality of solder balls and the passive device die, the underfill extending continuously from a lateral surface of the passive device die to the package substrate, the underfill further extending continuously from the second surface of the second redistribution structure to the package substrate; and
a plurality of stacked dies, wherein the plurality of stacked dies is directly bonded to the first surface of the first redistribution structure with a dielectric-to-dielectric bond and a metal-to-metal bond, wherein the plurality of stacked dies and the second die each overlaps the passive device die.

2. The package of claim 1, wherein the interposer further comprises:
a plurality of through vias in the semiconductor substrate, wherein the plurality of through vias electrically connect the first redistribution structure to the second redistribution structure.

3. The package of claim 1, wherein the passive device die is directly bonded to the second surface of the second redistribution structure with a dielectric-to-dielectric bond and a metal-to-metal bond.

4. The package of claim 1, wherein the plurality of stacked dies further overlaps a first solder ball of the plurality of solder balls, wherein the second die further overlaps a second solder ball of the plurality of solder balls, and wherein the first solder ball and the second solder ball are disposed on opposing sides of the passive device die.

5. The package of claim 1, wherein the second die is disposed between the first die and the plurality of stacked dies, wherein the first die is taller than the second die, and wherein a lateral distance between the first die and the second die is less than a lateral distance between the second die and the plurality of stacked dies.

6. The package of claim 5, wherein the plurality of stacked dies is taller than the first die and the second die.

7. The package of claim 5, wherein a lateral distance between the first die and a first external sidewall of the encapsulant is less than a lateral distance between the plurality of stacked dies and a second external sidewall of the encapsulant, and wherein the first external sidewall of the encapsulant and the second external sidewall of the encapsulant are opposite to each other.

8. The package of claim 1, wherein the passive device die does not overlap any conductive features within the solder resist in a cross-sectional view.

9. A semiconductor package comprising:
a plurality of first dielectric layers, of the plurality of first dielectric layers having a first metallization pattern disposed therein;
a bonding layer over the plurality of first dielectric layers;
a plurality of bonding pads in the bonding layer;
a first die comprising:
a first insulating layer touching the bonding layer; and
first conductive pads touching the plurality of bonding pads;
a die stack comprising:
a second insulating layer touching the bonding layer; and
second conductive pads touching the plurality of bonding pads;
an encapsulant over the bonding layer, the encapsulant being disposed around the die stack and the first die;
an integrated passive device (IPD) bonded without solder connections to an opposite side of the plurality of first dielectric layers as the first die and the die stack;
a plurality of conductive connectors disposed at the opposite side of the plurality of first dielectric layers as the first die and the die stack, wherein the plurality of conductive connectors is disposed at a same level as the IPD, the plurality of conductive connectors being directly bonded to a surface of a package substrate; and
an underfill around the plurality of conductive connectors and the IPD, the underfill extending continuously from the plurality of first dielectric layers to the package substrate, the underfill further extending continuously from the IPD to the package substrate, wherein the first die overlaps the IPD and a first interface between the underfill and a first sidewall of the IPD, and wherein the die stack overlaps the IPD and a second interface between the underfill and a second sidewall of the IPD.

10. The semiconductor package of claim 9 further comprising:
a plurality of second dielectric layers, of the plurality of second dielectric layers having a second metallization pattern disposed therein;
a semiconductor substrate between the plurality of first dielectric layers and the plurality of second dielectric layers, wherein the semiconductor substrate is free of any active devices; and
a plurality through vias extending through the semiconductor substrate.

11. The semiconductor package of claim 9, wherein the same surface is a surface of the plurality of first dielectric layers.

12. The semiconductor package of claim 9, wherein the plurality of conductive connectors comprises solder.

13. A package comprising:
an interposer free of active devices, the interposer comprising:
a substrate;
a plurality of conductive through vias extending through the substrate;
a first redistribution structure on the substrate; and
a second redistribution structure on an opposing side of the substrate as the first redistribution structure, wherein the second redistribution structure comprises first conductive feature and a second conductive feature disposed at a same level;
a first semiconductor die directly bonded to the first redistribution structure by a dielectric-to-dielectric bond and a metal-to-metal bond;
a second semiconductor die directly bonded to the first redistribution structure by a dielectric-to-dielectric bond and a metal-to-metal bond;
a die stack directly bonded to the first redistribution structure by a dielectric-to-dielectric bond and a metal-to-metal bond;
an encapsulant around the first semiconductor die, the second semiconductor die, and the die stack;
a first solder connector contacting the first conductive feature; and
a passive device die directly bonded to the second redistribution structure by a dielectric-to-dielectric bond and a metal-to-metal bond, wherein the passive device die contacts the second conductive feature, wherein the die stack overlaps the passive device die and a first external sidewall of the passive device die, and wherein the second semiconductor die overlaps the passive device die and a second external sidewall of the passive device die, the first external sidewall of the passive device die and the second external sidewall of the passive device die being opposite to each other.

14. The package of claim 13, wherein the plurality of conductive through vias electrically connects the first redistribution structure to the second redistribution structure.

15. The package of claim 13, wherein the first solder connector extends farther from the second redistribution structure than the passive device die.

16. The package of claim 13, wherein the second redistribution structure further comprises a third conductive feature disposed at the same level as the first conductive feature and the second conductive feature, wherein the package further comprises a second solder connector contacting the third conductive feature, and wherein the passive device die is disposed between the first solder connector and the second solder connector.

17. The package of claim 16 further comprising:
an underfill around the first solder connector, the second solder connector, and the passive device die; and
a package substrate bonded to the first solder connector and the second solder connector, wherein the underfill is disposed between a top surface of the package substrate and a bottom surface of the passive device die.

18. The package of claim 13, wherein top surfaces of the encapsulant and the die stack are level, and wherein the encapsulant covers top surfaces of the first semiconductor die and the second semiconductor die.

* * * * *